(12) United States Patent
Buis

(10) Patent No.: US 8,279,408 B2
(45) Date of Patent: Oct. 2, 2012

(54) OBJECT SUPPORT POSITIONING DEVICE AND LITHOGRAPHIC APPARATUS

(75) Inventor: Edwin Johan Buis, Belfeld (NL)

(73) Assignee: ASML Netherlands B.V., Veldhoven (NL)

( * ) Notice: Subject to any disclaimer, the term of this patent is extended or adjusted under 35 U.S.C. 154(b) by 648 days.

(21) Appl. No.: 12/484,764

(22) Filed: Jun. 15, 2009

(65) Prior Publication Data
US 2009/0323038 A1  Dec. 31, 2009

Related U.S. Application Data

(60) Provisional application No. 61/129,461, filed on Jun. 27, 2008.

(51) Int. Cl.
G03B 27/58 (2006.01)
H02K 41/02 (2006.01)
F16C 32/06 (2006.01)

(52) U.S. Cl. ............. 355/72; 310/12.06; 384/12
(58) Field of Classification Search ............ 355/72, 355/75, 53; 384/12; 310/12.01, 12.05, 12.06
See application file for complete search history.

(56) References Cited

U.S. PATENT DOCUMENTS

| | | | | |
|---|---|---|---|---|
| 3,658,393 | A | * | 4/1972 | Luthi ............... 384/12 |
| 4,448,460 | A | * | 5/1984 | Yamamoto ........... 384/12 |
| 5,815,246 | A | | 9/1998 | Sperling et al. |
| 5,971,614 | A | * | 10/1999 | Kane et al. ............ 384/12 |
| 6,328,473 | B1 | * | 12/2001 | Tokushima et al. ...... 384/12 |
| 2001/0006762 | A1 | * | 7/2001 | Kwan et al. ........... 430/311 |
| 2001/0050341 | A1 | * | 12/2001 | Kwan et al. .......... 250/491.1 |
| 2004/0252287 | A1 | * | 12/2004 | Binnard et al. ......... 355/53 |
| 2005/0151948 | A1 | * | 7/2005 | Tegenbosch .......... 355/67 |

FOREIGN PATENT DOCUMENTS

| | | |
|---|---|---|
| JP | 63-231019 A | 9/1988 |
| JP | 2001-143984 A | 5/2001 |
| WO | 98/28665 A1 | 7/1998 |
| WO | 98/40791 A1 | 9/1998 |

OTHER PUBLICATIONS

Office Action in related Japanese Application No. JP2009-145897 mailed Aug. 12, 2011.

* cited by examiner

Primary Examiner — Hung Henry Nguyen
Assistant Examiner — Steven H Whitesell Gordon
(74) Attorney, Agent, or Firm — Pillsbury Winthrop Shaw Pittman LLP

(57) ABSTRACT

An object support positioning device configured to position an object support includes first and second side-beams having respective first and second sliders mounted thereon, first and second motors configured to move the first and second sliders along each respective side beam, a cross beam mounted proximate first and second ends thereof to the first and second sliders respectively and having a third slider mounted thereto, the cross-beam and the first and second slider being mounted together, and a third motor configured to move the third slider longitudinally along the cross-beam, the third slider being adapted to support the one object support. A fluid bearing is provided in at least one of the first, second and third sliders, the fluid bearing including multiple bearing surfaces to exert reaction forces in a first direction, the first direction being perpendicular to the sliding direction of the at least one slider.

26 Claims, 5 Drawing Sheets

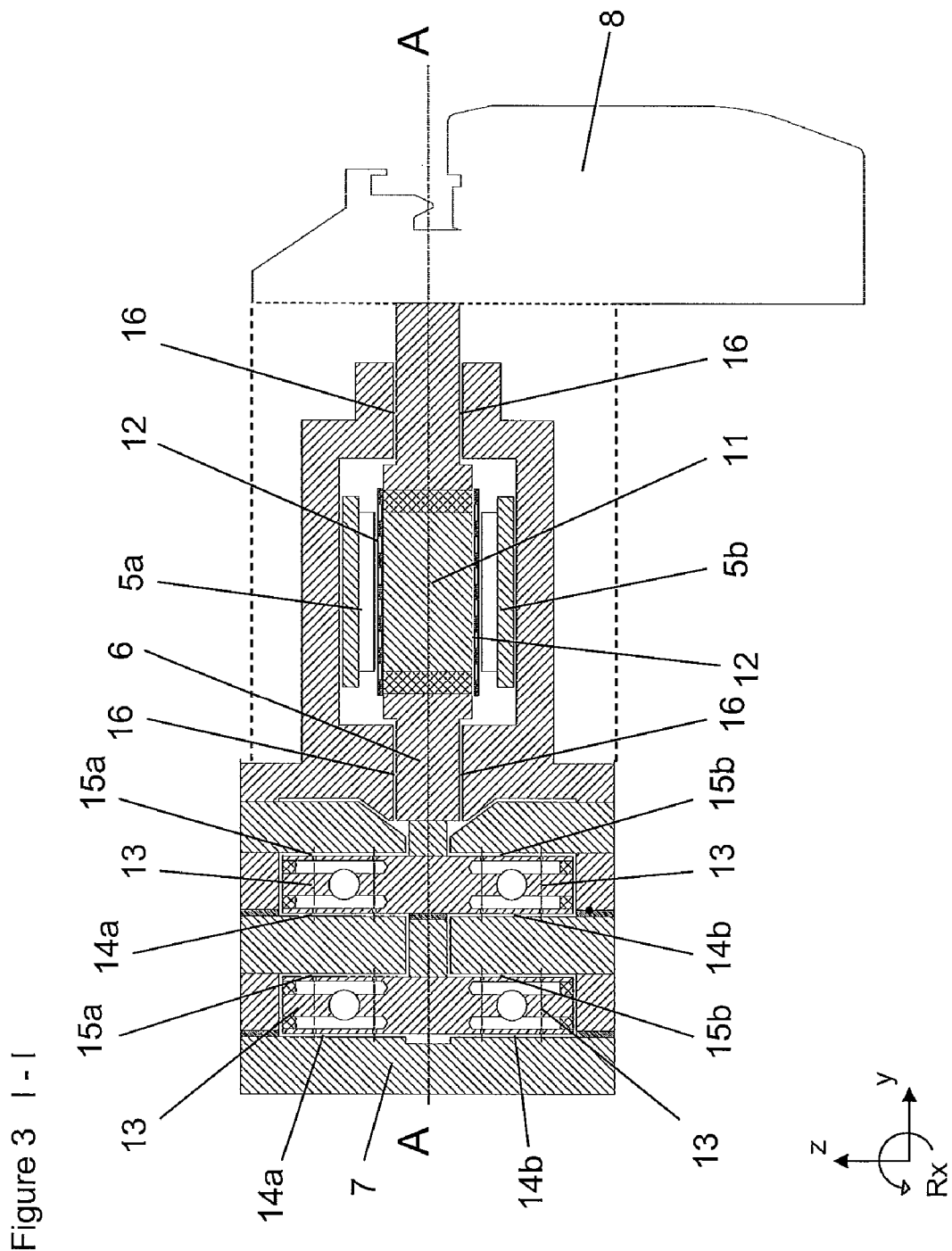
Figure 3 I-I

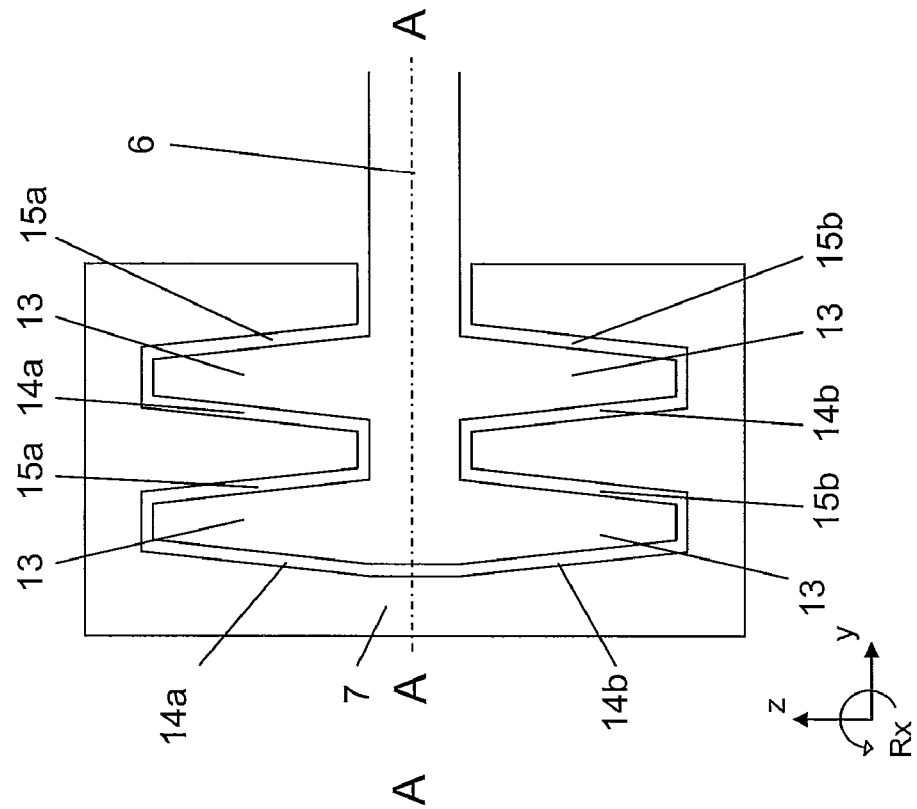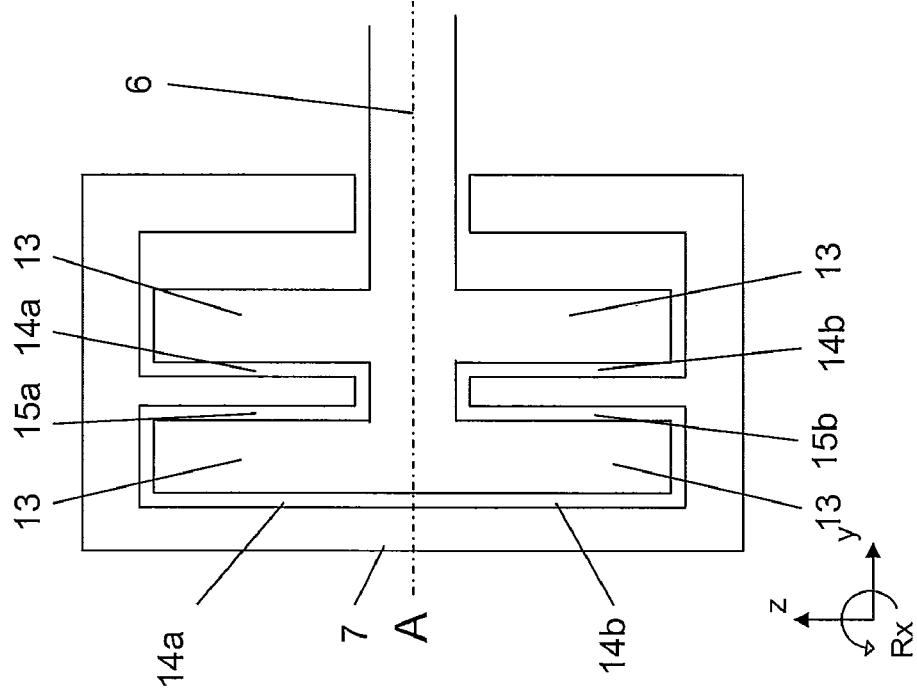

OBJECT SUPPORT POSITIONING DEVICE AND LITHOGRAPHIC APPARATUS

CROSS REFERENCE TO RELATED APPLICATIONS

This application claims priority and benefit under 35 U.S.C. §119(e) to U.S. Provisional Patent Application No. 61/129,461, entitled "Object Support Positioning Device and Lithographic Apparatus", filed on Jun. 27, 2008. The content of that application is incorporated herein in its entirety by reference.

FIELD

The present invention relates to an object support positioning device and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a known lithographic apparatus, the drive unit of the positioning device for the substrate table may include two linear Y-motors each of which includes a stator extending parallel to the Y-direction and secured to a base of the positioning device, and a translator (Y-slider) movable along the stator. The base may be secured to the frame of the lithographic device. The drive unit may further include a linear X-motor that includes a stator extending parallel to the X-direction and a translator (X-slider) which can be moved along the stator. The stator of the X-motor may be mounted on an X-beam that is secured, near its respective ends, to the translators (Y-sliders) of the linear Y-motors. The arrangement is therefore H-shaped, with the two Y-motors forming the uprights and the X-motor forming the cross-piece, and this arrangement is often referred to as an H-drive.

The driven object, in this case the substrate table, may be provided with a so-called air foot. The air foot includes a gas bearing that is configured to guide the substrate table so as to be movable over a guide surface of the base extending at right angles to the Z-direction.

In a lithographic apparatus, reactions on the machine frame to acceleration forces used to position the patterning device (reticle) and substrate (wafer) to nanometer accuracies are a cause of vibration, impairing the accuracy of the apparatus. To minimize the effects of vibrations, it is possible to provide an isolated metrology frame, on which all position sensing devices are mounted, and to channel all reaction forces to a so-called force or reaction frame that is separated from the remainder of the apparatus.

In an alternative arrangement, the reaction to the driving force is channeled to a balance mass, which is normally heavier than the driven mass which is free to move relative to the remainder of the apparatus. The reaction force is spent in accelerating the balance mass and does not significantly affect the remainder of the apparatus. Balance masses moveable in three degrees of freedom in a plane are described in WO 98/40791, WO 98/28665 and U.S. Pat. No. 5,815,246.

FIG. 6 shows a cross section of a prior art X-motor configuration. The X-motor includes X-beam 107, a stator including a first stator part 105a and a second stator part 105b each mounted on the X-beam 107 and a translator 106 which can translate along the stator 105 and X-beam 107 in the X-direction, which is perpendicular to the plane of the drawing. An air bearing 108 is provided between the X-beam 107 and the translator 106 in order to provide an air cushion between the X-beam and the translator. The air bearing is pre-tensioned with the attraction force between the stator 105 and a motor part 109 of the translator 106.

When the X-beam 107 is accelerated in the y-direction by Y motors, the air bearing 108 pushes the translator in the y-direction. Due to the presence of the air bearing 108, mechanical contact between X-beam 107 and the translator 106 is avoided, so that the translator may slide in the X-direction.

However, due to increasing demands on acceleration of the substrate stage, the force and/or torque to be handled by the air bearing also increases. However, the maximum bearing surface of the air bearing is limited due to the dimensions of the X-beam. To deal with these higher forces and/or torques, the dimensions of the X-beam, for instance the height, could be increased to make incorporation of a larger air bearing surface possible. However, increase of the height of the X-beam would have a considerable impact on the further system design, and is therefore not desirable.

SUMMARY

It is desirable to provide a positioning device for a lithographic apparatus having a bearing which is capable of handling relative large forces and/or torques, preferably without requiring change in the external dimension of the X-beam.

According to an embodiment of the invention, there is provided an object support positioning device constructed and arranged to position an object support, the object support positioning device including first and second side-beams having respective first and second sliders mounted thereon, first and second motors configured to move the first and second sliders along each respective side beam, a cross beam mounted proximate first and second ends thereof to the first and second sliders respectively and having a third slider mounted thereto, the cross-beam and the first and second slider being mounted together, a third motor configured to move the third slider longitudinally along the cross-beam, the third slider being adapted to support the one object support, wherein a fluid bearing arrangement is provided in at least one of the first, second and third sliders, the fluid bearing arrangement including multiple bearing surfaces to exert reaction forces in a first direction, the first direction being substantially perpendicular to the sliding direction of the at least one slider.

According to an embodiment of the invention, there is provided an object support positioning device constructed and arranged to position an object support, the object support positioning device including first and second side-beams having respective first and second sliders mounted thereon, first and second motors configured to move the first and second sliders along each respective side beam, a cross beam mounted proximate first and second ends thereof to the first and second sliders respectively and having a third slider mounted thereto, the cross-beam and the first and second slider being mounted together, and a third motor configured to move the third slider longitudinally along the cross-beam, the third slider being adapted to support the one object support, wherein a fluid bearing arrangement is provided in at least one of the first, second and third sliders, the fluid bearing arrangement including multiple bearing surfaces, being arranged to exert in combination a reaction torque in a first rotation direction, the first rotation direction being at least partially in a plane substantially perpendicular to the sliding direction of the at least one slider.

According to an embodiment of the invention, there is provided a lithographic projection apparatus including an illumination system configured to condition a radiation beam; a first object support constructed to support a patterning device, the patterning device being capable of imparting the radiation beam with a pattern in its cross-section to form a patterned radiation beam; a second object support constructed to hold a substrate; a projection system configured to project the patterned radiation beam onto a target portion of the substrate, and an object support positioning device constructed and arranged to position at least one of the object supports, the object support positioning device including first and second side-beams having respective first and second sliders mounted thereon, first and second motors configured to move the first and second sliders along each respective side beam, a cross beam mounted proximate first and second ends thereof to the first and second sliders respectively and having a third slider mounted thereto, the cross-beam and the first and second slider being mounted together, and a third motor configured to move the third slider longitudinally along the cross-beam, the third slider being adapted to support the one object support, wherein a fluid bearing arrangement is provided in at least one of the first, second and third sliders, the fluid bearing g arrangement including multiple bearing surfaces to exert reaction forces in a first direction, the first direction being substantially perpendicular to the sliding direction of the at least one slider.

According to an embodiment of the invention, there is provided a lithographic projection apparatus including: an illumination system configured to condition a radiation beam; a first object support constructed to support a patterning device, the patterning device being capable of imparting the radiation beam with a pattern in its cross-section to form a patterned radiation beam; a second object support constructed to hold a substrate; a projection system configured to project the patterned radiation beam onto a target portion of the substrate, and an object support positioning device constructed and arranged to position at least one of the object supports, the object support positioning device including: first and second side-beams having respective first and second sliders mounted thereon, first and second motors configured to move the first and second sliders along each respective side beam, a cross beam mounted proximate first and second ends thereof to the first and second sliders respectively and having a third slider mounted thereto, the cross-beam and the first and second slider being mounted together, and a third motor configured to move the third slider longitudinally along the cross-beam, the third slider being adapted to support the one object support, wherein a fluid bearing arrangement is provided in at least one of the first, second and third sliders, the fluid bearing arrangement including multiple bearing surfaces, being arranged to exert in combination a reaction torque in a first rotation direction, the first rotation direction being at least partially in a plane substantially perpendicular to the sliding direction of the at least one slider.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 depicts a cross section of a X-slider on an X-beam having an air bearing arrangement according to an embodiment of the invention;

FIG. 4 depicts schematically a bearing arrangement according to an embodiment of the invention;

FIG. 5 depicts schematically a bearing arrangement according to an embodiment of the invention.

DETAILED DESCRIPTION

Figure 1:
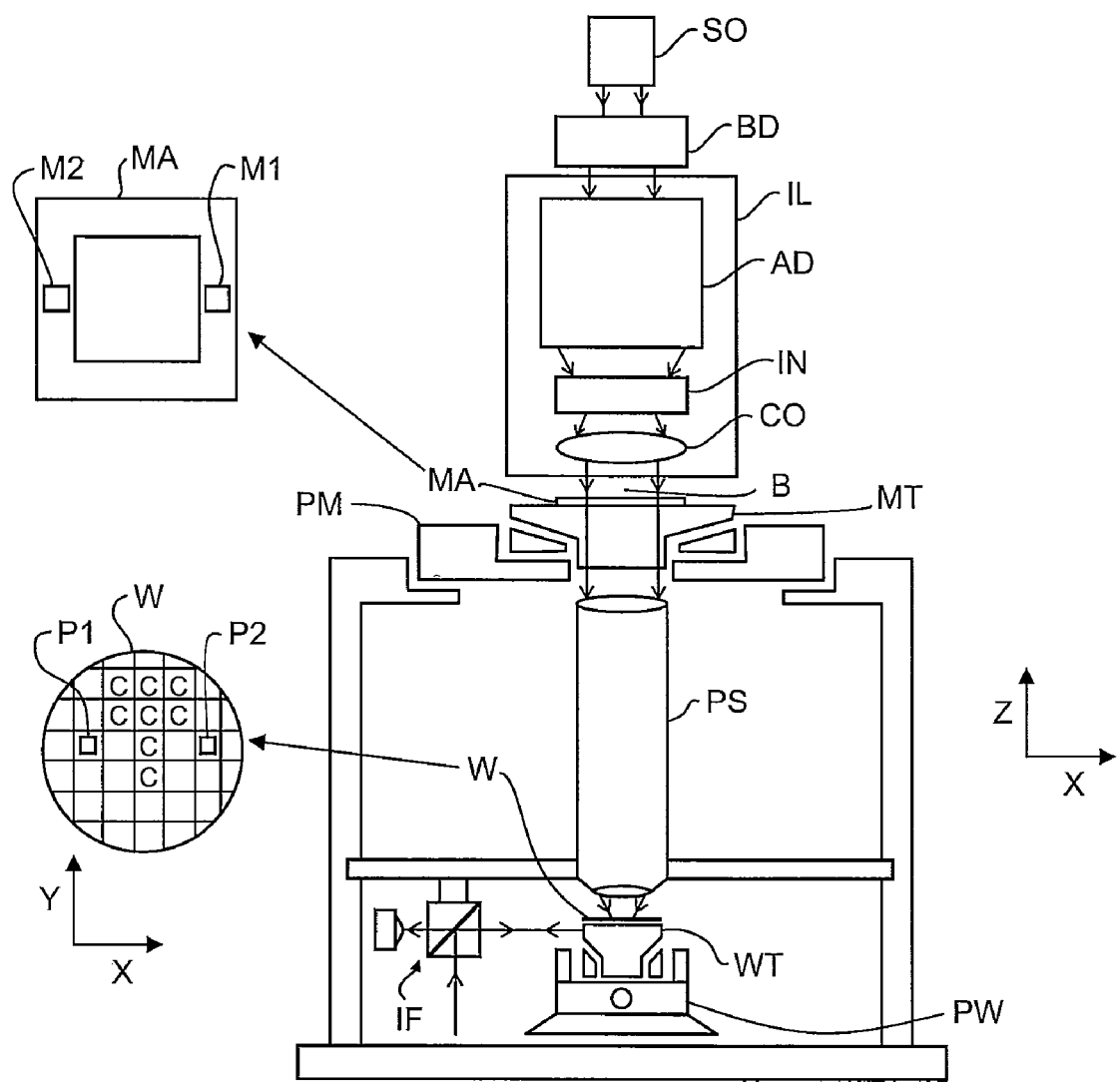
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
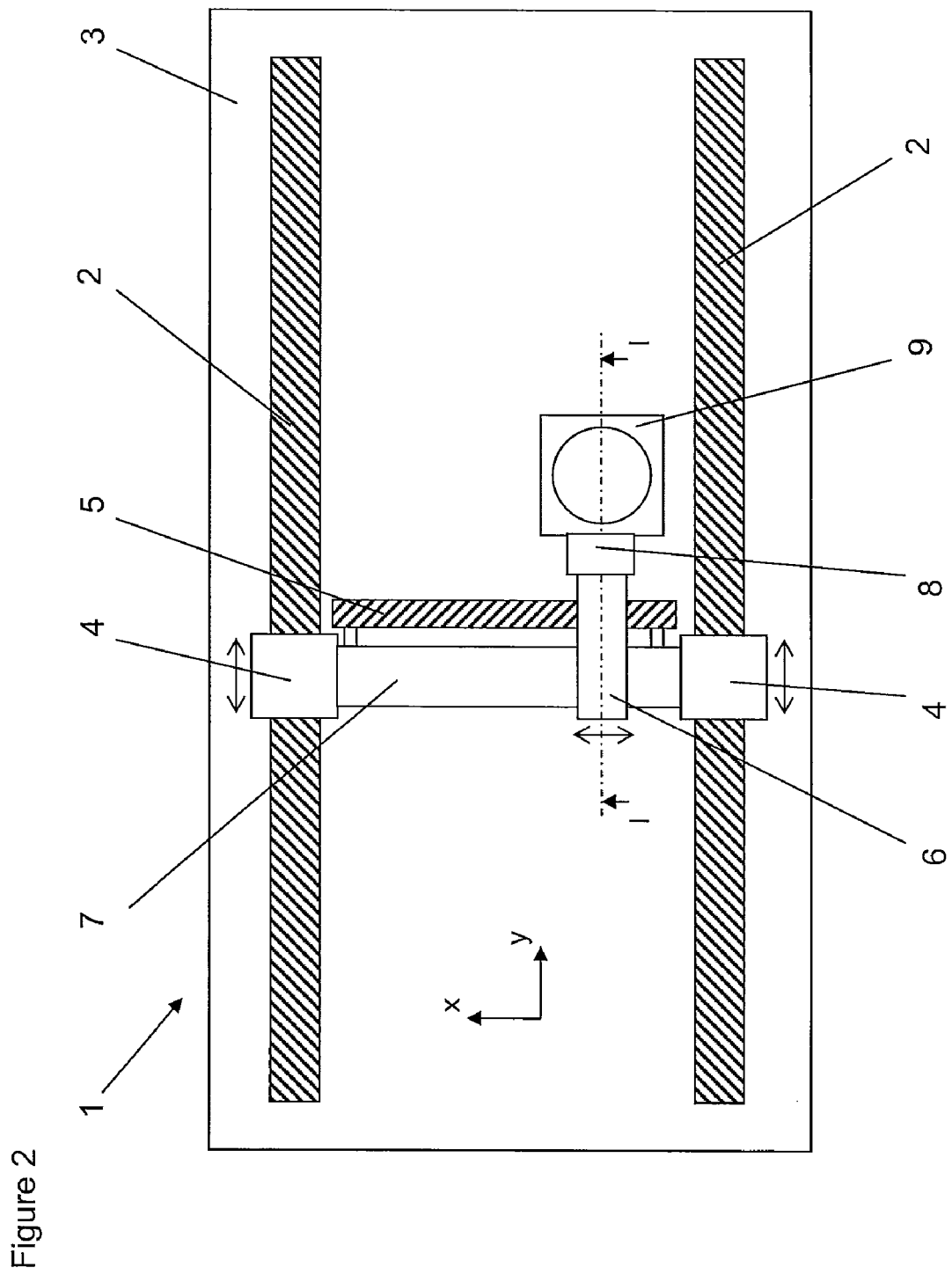
FIG. 2 depicts a top view of a positioning device according to an embodiment of the invention.

FIG. 2 shows a schematic top view of a positioning device for a substrate support according to an embodiment of the invention, generally indicated with the reference numeral 1. The positioning device 1 includes two linear Y-motors each of which includes a stator 2 extending parallel to the Y-direction and secured to a base 3 of the positioning device, and a Y-translator 4 (also referred to as Y-slider) movable along the stator.

The base 3 is secured to the frame of the lithographic apparatus. The positioning device 1 further includes a linear X-motor that includes a stator 5 extending parallel to the X-direction and an X-translator 6 (also referred to as X-slider) which can be moved along the stator 5. The stator 5 of the X-motor is mounted on an X-beam 7 that is secured, near its respective ends, to the translators 4 (Y-sliders) of the linear Y-motors. The X-translator 6 is connected to a support part 8 on which a substrate support 9 may be mounted. Preferably, an air bed is provided to support the substrate support 9, so that not the whole weight of the substrate support 9 is carried by the support part 8.

The arrangement of the Y-motors and X-motor is H-shaped, with the two Y-motors forming the uprights and the X-motor forming the cross-piece, and this arrangement is often referred to as an H-drive.

The sliding support of the X- and Y-translators is obtained by a fluid bearing arrangement (also termed hereinafter fluid bearing) in each of the translators. The sliding support of the X-translator will now be discussed in more detail.

FIG. 3 shows a cross-section of the X-motor along the line I-I of FIG. 2. The cross section I-I shows in detail the stator 5, the X-translator 6, and the X-beam 7. The support part 8 configured to support a substrate support 9 is shown in a ghost line.

The stator 5 includes an upper part 5a and a lower part 5b between which a movable motor part 11 of the X-translator 6 is arranged. The movable motor part 11 is provided with cooling channels 12 configured to cool the linear X-motor.

At one end of the movable motor part 11 (right side in FIG. 3), the support part 8 is connected. At the other end of the movable motor part 11, the X-translator 6 extends in the X-beam 7 and includes four air bearing arms 13. The bearing arms 13 and X-beam 7 provide an air bearing arrangement having air bearing surfaces between the X-translator 6 and interior surfaces of the X-beam 7 in order to provide an air bearing to handle forces in the y-direction, while at the same time making a contactless sliding movement of the X-translator 6 with respect to the X-beam 7 and stator 5 possible. The bearing surfaces include four first bearing surfaces 14a, 14b to contactless transfer forces from the X-beam 7 to the X-translator 6 in the positive y direction, while four second bearing surfaces 15a, 15b are provided to contactless transfer forces in the opposite y-direction.

Furthermore, on opposite sides of the movable motor part 11 air bearings 16 are provided between the X-beam 7 and the X-stator 6, to handle forces in the positive and negative Z direction.

The first four bearing surfaces 14a, 14b of the air bearing arrangement are provided substantially parallel to each other and form two pair of two bearing surfaces 14a, 14b which are arranged in spaced relationship as a result of the four-bearing-arms 13 construction. Likewise, the four second bearing surfaces 15a, 15b of the air bearing arrangement are provided substantially parallel to each other and form two pair of two bearing surfaces 15a, 15b which are arranged in spaced relationship. This arrangement makes it possible to provide a relative large area of bearing surfaces within certain dimensions, in particular within the dimensions of the known X-beam 7.

The combination of four first bearing surfaces 14a, 14b, as shown in FIG. 3, may provide a larger force than one bearing surface covering the same area as the bearing surfaces are spaced in the direction in which they can provide a counter-force. As a result, at the same pressure, a larger force can be provided by the bearing arrangement while the outer dimensions of the X-beam 7 do not have to be increased when compared with a prior art air bearing arrangement between an X-translator 106 and an X-beam 107 as shown in FIG. 6.

For the opposite y-direction also a larger air bearing surface is provided by the four second bearing surfaces 15a, 15b as would be the case with a single bearing surface provided in the same X-beam dimensions.

With the increased air bearing surfaces in the Y-direction, higher accelerations in the Y-direction can be handled in the air bearing arrangement of the X-beam, without enlarging the dimensions of the X-beam.

Figure 6:
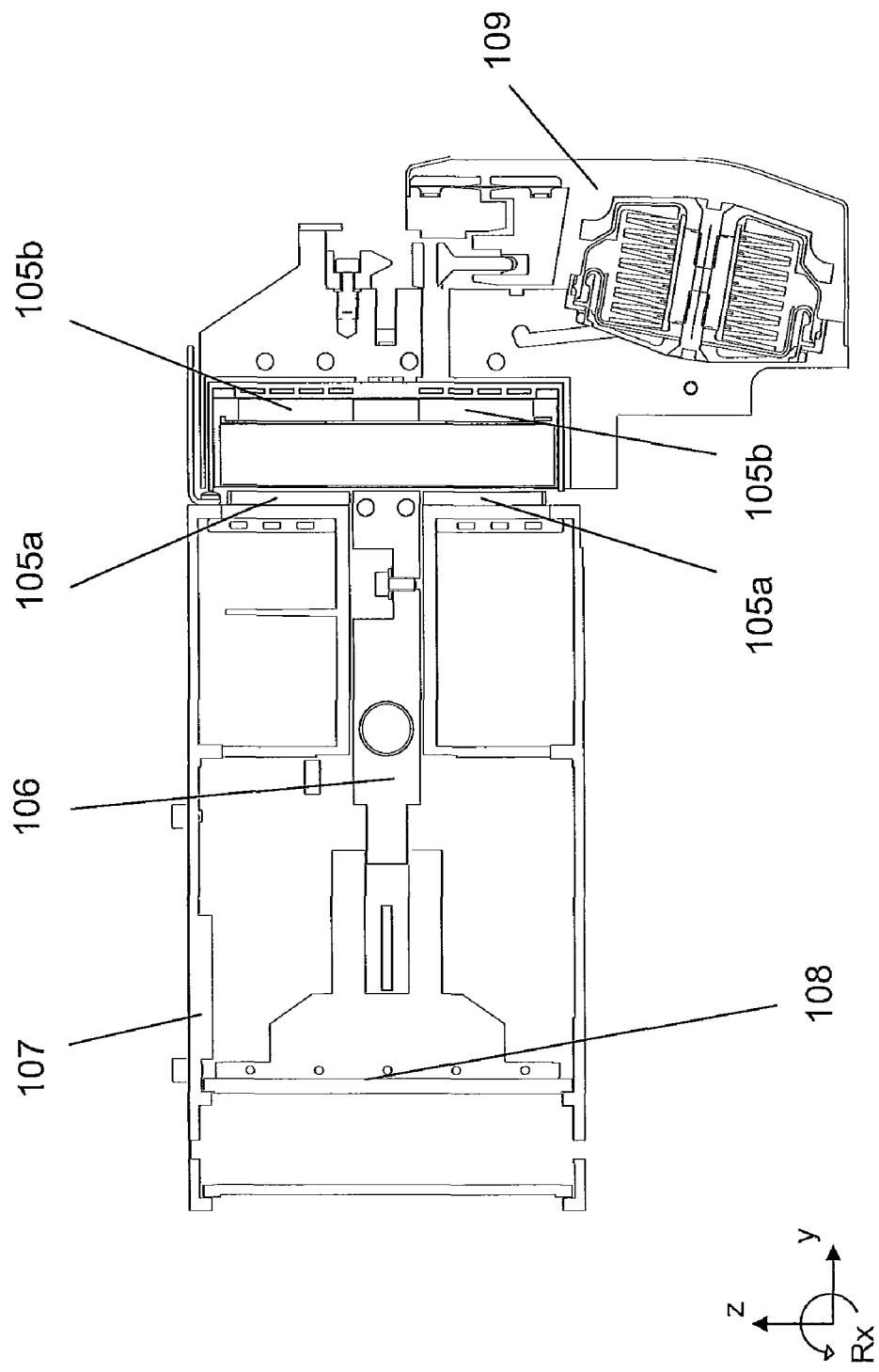
FIG. 6 depicts in cross section of a prior art air bearing arrangement of an X-slider on an X-beam.

Similarly, the upper first bearing surfaces 14a in combination with the lower second bearing surfaces 15b may provide a larger torque in a first rotation direction about the x-axis Rx than would be the case with a single bearing surface in the same X-beam dimensions as shown in FIG. 6. And, likewise, the lower first bearing surfaces 14b in combination with the upper second bearing surfaces 15a may provide a larger torque in the opposite rotation direction about the x-axis Rx, than would be the case with a single bearing surface in the same X-beam dimensions.

Thus, with the increased air bearing surfaces, higher accelerations in the Rz-directions can be handled in the air bearing arrangement of the X-beam, without enlarging the dimensions of the X-beam.

By provision of the air bearing arrangements for the y-directions and z-directions, a sliding movement in the X-direction between the X-translator 6 and the X-beam 7 with a very low friction may be possible, while at the same time large acceleration forces and/or torques can be transferred from the X-beam 7 which is accelerated by the Y-motors to the X-translator 6 which is connected to the support part 8 in order to accelerate the substrate support 9.

In an alternative arrangement also one or more first bearing surfaces 14a, 14b and/or one or more second bearing surfaces 15a, 15b may be provided, whereby at least two bearing surfaces are provided in a spaced relationship to counteract forces in a single direction. Such embodiment is shown in FIG. 4. The X-translator 6 includes four bearing arms. The X-beam 7 and the bearing arms 13 are designed such that there are four first bearing surfaces 14a, 14b but only two bearing surfaces 15a, 15b. As a result, the force which may be transferred from the X-beam 7 to the X-translator 6 is larger in the positive y-direction than in the negative y-direction, since for the positive y-direction the area of the first bearing surfaces 14a, 14b is approximately twice the area of the second bearing surfaces 15a, 15b. Such embodiment may be applied when larger accelerations only occur in one direction.

In the embodiment of FIG. 3, the first and second bearing surfaces 14a, 14b and 15a, 15b are arranged perpendicular to the axis A-A which is parallel to the y-direction, so that the bearing arrangement may counteract forces substantially only in the positive or negative y-directions. In an alternative embodiment, one or more of the first and/or second bearing surfaces are arranged obliquely with respect to the axis A-A so that the bearing surfaces also have a Z-component. By making the bearing surfaces also symmetrical with respect to the axis A-A, a self centering air bearing arrangement may be obtained, i.e. when a gas pressure exists on the bearing surfaces 14a, 14b or 15a, 15b between the X-beam 7 and the X-translator 6, the X-translator 6 and X-beam are also aligned with respect to the axis A-A. An example of such embodiment is shown in FIG. 5.

Hereinabove the bearing arrangement of an X-translator 6 has been described in detail. A similar construction may be used for providing a sliding support of the y-translators 4 on the stators 2. The directions x, y and z are used to indicate the main directions in which the substrate table 9 may be moved. Also, the terms upper and lower are used to indicate different bearing surfaces. These directions and terms should be regarded as indicative, and for explanatory use only. An embodiment of the present invention is not limited to system in these directions and may be used in any positioning device to provide the possibility of sliding movement between a translator and stator element. Also the terms upper and lower are only used for indication of the respective parts, and should not be regarded as limiting the invention to the respective position or orientation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning device constructed and arranged to position an object support, the positioning device comprising:
   first and second side beams having respective first and second sliders mounted thereon;
   first and second motors configured to move the first and second sliders along each respective side beam;
   a cross beam mounted proximate first and second ends thereof to the first and second sliders respectively and having a third slider mounted thereto, the cross-beam and the first and second sliders being mounted together;
   a third motor configured to move the third slider longitudinally along the cross-beam, the third slider being adapted to support the object support; and
   a fluid bearing arranged in at least one of the first, second and third sliders, the fluid bearing comprising multiple bearing surfaces configured to, in use, exert reaction forces in a same first direction, the first direction being substantially perpendicular to a sliding direction of the at least one slider,
   wherein two of the multiple bearing surfaces are arranged in different planes that are spaced apart from each other in the first direction.

2. The device of claim 1, wherein the multiple bearing surfaces are arranged substantially parallel to each other.

3. The device of claim 1, wherein the different planes are substantially parallel to each other.

4. The device of claim 1, wherein the fluid bearing is an air bearing comprising multiple air bearing surfaces.

5. The device of claim 1, wherein the multiple bearing surfaces are arranged at an oblique angle with respect to the first direction.

6. The device of claim 1, wherein the fluid bearing comprises one or more second bearing surfaces configured to exert reaction forces in a second direction which is opposite to the first direction.

7. The device of claim 1, wherein the fluid bearing comprises multiple second bearing surfaces configured to exert reaction forces in a second direction which is opposite to the first direction.

8. The device of claim 7, wherein the multiple second bearing surfaces are arranged substantially parallel to, or spaced apart from, or both substantially parallel to and spaced apart from, each other in the second direction.

9. The device of claim 1, wherein the fluid bearing is provided in the third slider.

10. The device of claim 1, wherein the fluid bearing comprises one or more fluid bearings configured to exert a reaction force in a third direction that is substantially perpendicular to the first direction.

11. The device of claim 10, wherein the fluid bearing comprises one or more fluid bearings configured to exert a reaction force in a fourth direction opposite to the third direction.

12. The device of claim 1, wherein the at least one of the first, second and third sliders comprises two or more bearing arms extending at least in a direction substantially perpendicular to the first direction, the two or more bearing arms each delimiting one of the multiple bearing surfaces.

13. The device of claim 1, wherein the at least one of the first, second and third sliders comprises four bearing arms extending at least in a direction substantially perpendicular to the first direction, the four bearing arms each delimiting one of the multiple bearing surfaces.

14. The device of claim 6, wherein the at least one of the first, second and third sliders comprises four bearing arms extending at least in a direction substantially perpendicular to the first direction, the four bearing arms each delimiting at least one of the multiple bearing surfaces and at least one of the second bearing surfaces.

15. A positioning device constructed and arranged to position an object support, the positioning device comprising:
  first and second side beams having respective first and second sliders mounted thereon;
  first and second motors configured to move the first and second sliders along each respective side beam;
  a cross beam mounted proximate first and second ends thereof to the first and second sliders respectively and having a third slider mounted thereto, the cross-beam and the first and second sliders being mounted together;
  a third motor configured to move the third slider longitudinally along the cross-beam, the third slider being adapted to support the object support; and
  a fluid bearing arranged in at least one of the first, second and third sliders, the fluid bearing comprising multiple bearing surfaces that are arranged, in use, to exert, in combination, a reaction torque in a same first rotation direction, the first rotation direction being at least partially in a plane substantially perpendicular to a sliding direction of the at least one slider,
  wherein two of the multiple bearing surfaces are arranged in different planes that are spaced apart from each other in the first direction.

16. The device of claim 15, wherein the multiple bearing surfaces are arranged substantially parallel to each other.

17. The device of claim 15, wherein the fluid bearing is an air bearing comprising multiple air bearing surfaces.

18. The device of claim 15, wherein the multiple bearing surfaces are arranged at an oblique angle with respect to a direction substantially perpendicular to the sliding direction.

19. The device of claim 15, wherein the fluid bearing comprises one or more second bearing surfaces configured, in use, to exert, in combination, a reaction torque in a second rotation direction which is opposite to the first rotation direction.

20. The device of claim 15, wherein the fluid bearing comprises multiple second bearing surfaces configured, in use, to exert, in combination, a reaction torque in a second rotation direction which is opposite to the first rotation direction.

21. The device of claim 20, wherein the multiple second bearing surfaces are arranged parallel to, or spaced apart from, or both parallel to and spaced apart from, each other in a direction substantially perpendicular to the sliding direction.

22. The device of claim 15, wherein the fluid bearing is provided in the third slider.

23. The device of claim 15, wherein the at least one of the first, second and third sliders comprises two or more bearing arms extending in the plane substantially perpendicular to the sliding direction, the two or more bearing arms each delimiting one of the multiple bearing surfaces.

24. The device of claim 20, wherein the at least one of the first, second and third sliders comprises four bearing arms extending in the plane substantially perpendicular to the sliding direction, the four bearing arms each delimiting one of the multiple bearing surfaces.

25. The device of claim 20, wherein the at least one of the first, second and third sliders comprises four bearing arms extending in the plane substantially perpendicular to the sliding direction, the four bearing arms each delimiting at least one of the multiple bearing surfaces and at least one of the multiple second bearing surfaces.

26. A lithographic projection apparatus comprising:
  a first object support constructed to support a patterning device, the patterning device being capable of imparting a radiation beam with a pattern in its cross-section to form a patterned radiation beam;
  a second object support constructed to hold a substrate;
  a projection system configured to project the patterned radiation beam onto a target portion of the substrate; and
  a positioning device constructed and arranged to position at least one of the object supports, the positioning device comprising
    first and second side beams having respective first and second sliders mounted thereon;
    first and second motors configured to move the first and second sliders along each respective side beam;
    a cross beam mounted proximate first and second ends thereof to the first and second sliders respectively and having a third slider mounted thereto, the cross-beam and the first and second sliders being mounted together;
    a third motor configured to move the third slider longitudinally along the cross-beam, the third slider being adapted to support the at least one object supports; and
    a fluid bearing arranged in at least one of the first, second and third sliders, the fluid bearing comprising multiple bearing surfaces configured to, in use, exert reaction forces in a same first direction, the first direction being substantially perpendicular to a sliding direction of the at least one slider,
  wherein two of the multiple bearing surfaces are arranged in different planes that are spaced apart from each other in the first direction.

* * * * *